(12) United States Patent
Hedler et al.

(10) Patent No.: US 7,663,248 B2
(45) Date of Patent: Feb. 16, 2010

(54) FLIP-CHIP COMPONENT

(75) Inventors: Harry Hedler, Germering (DE);
Thorsten Meyer, Regensburg (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 11/251,602

(22) Filed: Oct. 14, 2005

(65) Prior Publication Data

US 2006/0102998 A1 May 18, 2006

(30) Foreign Application Priority Data

Oct. 14, 2004 (DE) .................. 10 2004 050 178

(51) Int. Cl.
*H01L 23/52* (2006.01)
*H01L 23/48* (2006.01)
*H01L 29/40* (2006.01)

(52) U.S. Cl. .............................. 257/778; 257/E23.178; 257/686; 257/723; 257/738; 438/106; 438/110

(58) Field of Classification Search .......... 257/E23.069, 257/E23.07, E23.178, 778, 686, 698, 685, 257/723, 724, 738, E23.17, 786, 678; 438/106, 438/109, 110, 113
See application file for complete search history.

(56) References Cited

U.S. PATENT DOCUMENTS

| 5,213,748 | A | * | 5/1993 | Biswas et al. ............... 264/251 |
| 5,491,364 | A | * | 2/1996 | Brandenburg et al. ....... 257/786 |
| 5,763,294 | A | * | 6/1998 | Lin ............................. 438/111 |
| 5,835,355 | A | * | 11/1998 | Dordi .......................... 361/760 |
| 5,844,319 | A | * | 12/1998 | Gamota et al. ............... 257/778 |
| 5,900,675 | A |   | 5/1999 | Appelt et al. |
| 6,570,250 | B1 | * | 5/2003 | Pommer ..................... 257/731 |
| 6,952,048 | B2 | * | 10/2005 | Terui ........................... 257/678 |
| 6,965,160 | B2 | * | 11/2005 | Cobbley et al. ............. 257/686 |
| 7,224,062 | B2 | * | 5/2007 | Hsu ........................... 257/737 |
| 2003/0087475 | A1 | * | 5/2003 | Sterrett et al. ............... 438/108 |
| 2003/0218261 | A1 |   | 11/2003 | Capote et al. |
| 2004/0082107 | A1 |   | 4/2004 | Shi et al. |
| 2004/0087131 | A1 |   | 5/2004 | Brintzinger et al. |
| 2004/0124540 | A1 |   | 7/2004 | Chen et al. |
| 2004/0135252 | A1 |   | 7/2004 | Brintzinger |
| 2004/0191958 | A1 |   | 9/2004 | Hedler et al. |
| 2005/0078434 | A1 |   | 4/2005 | Ho |

FOREIGN PATENT DOCUMENTS

DE 101 45 382 A1 1/2003
DE 102 41 589 A1 3/2004

(Continued)

*Primary Examiner*—Chris C. Chu
(74) *Attorney, Agent, or Firm*—Slater & Matsil, L.L.P.

(57) ABSTRACT

A flip-chip component includes a chip with pads located on the chip and a chip frame, wherein the chip frame is arranged around the chip and is attached to the chip so that the active surface of the chip is substantially planar with a surface of the chip frame. A redistribution layer is attached to the chip and chip frame, and interconnections mechanically connect the redistribution layer and a board. Aspects of the invention improve the reliability of the flip-chip package by reducing shear stresses in the interconnections between the package and a board during changing temperatures. This is achieved by carefully selecting the material of the chip frame and designing the placement of the interconnections so that thermal expansion of the package matches that of the board during changing temperatures.

19 Claims, 4 Drawing Sheets

FOREIGN PATENT DOCUMENTS

| | | |
|---|---|---|
| DE | 102 58 081 A1 | 7/2004 |
| DE | 102 61 410 A1 | 7/2004 |
| DE | 102 58 093 B3 | 8/2004 |
| EP | 1 067 601 A1 | 1/2001 |
| EP | 1 369 919 A1 | 12/2003 |
| WO | WO 03/073500 A1 | 9/2003 |

* cited by examiner

FIG 1    (Prior art)
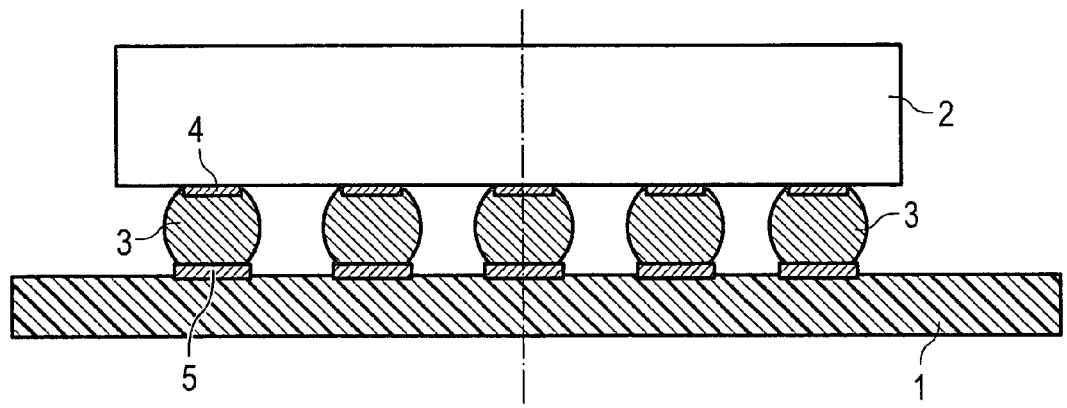
FIG 2    (Prior Art)
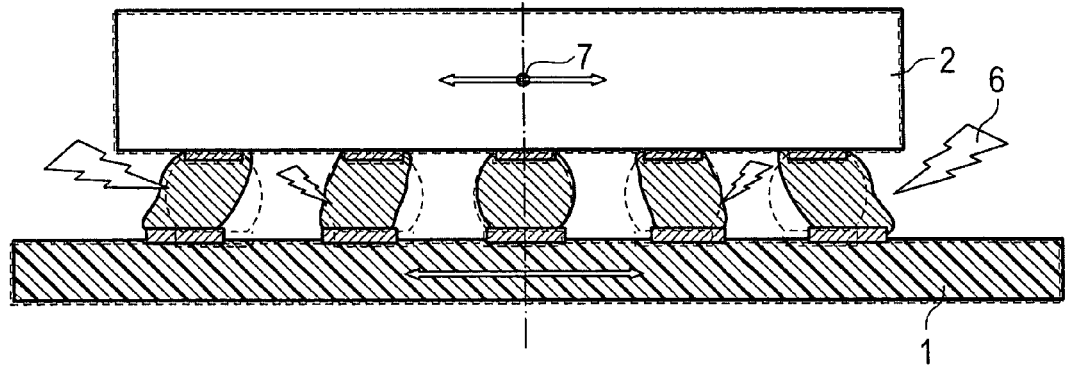

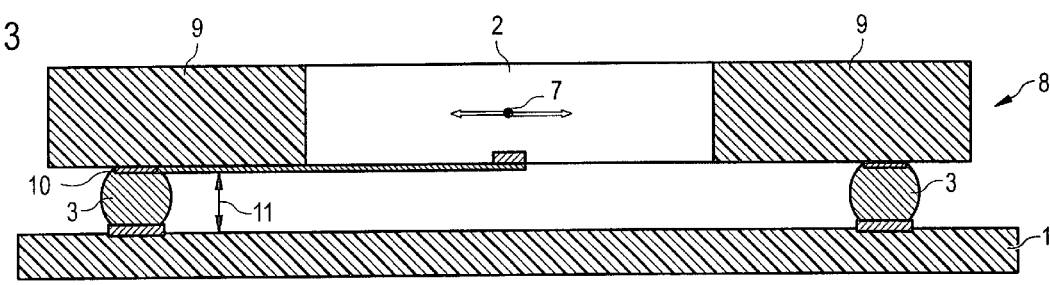
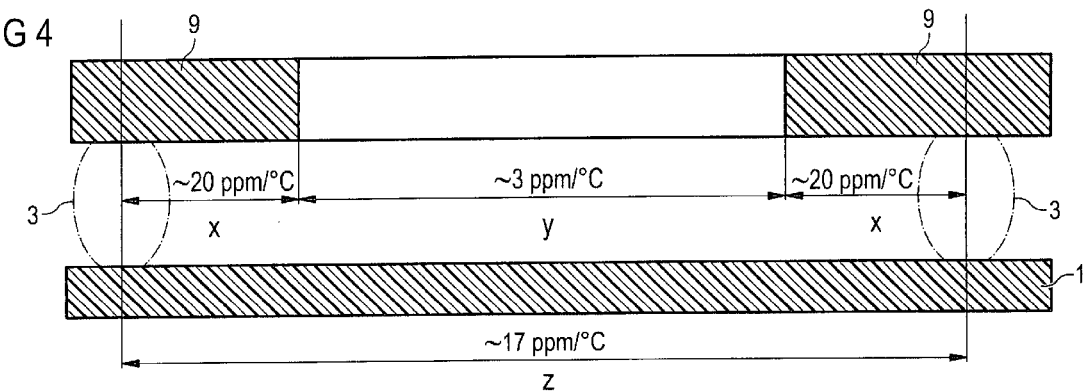

FIG 5
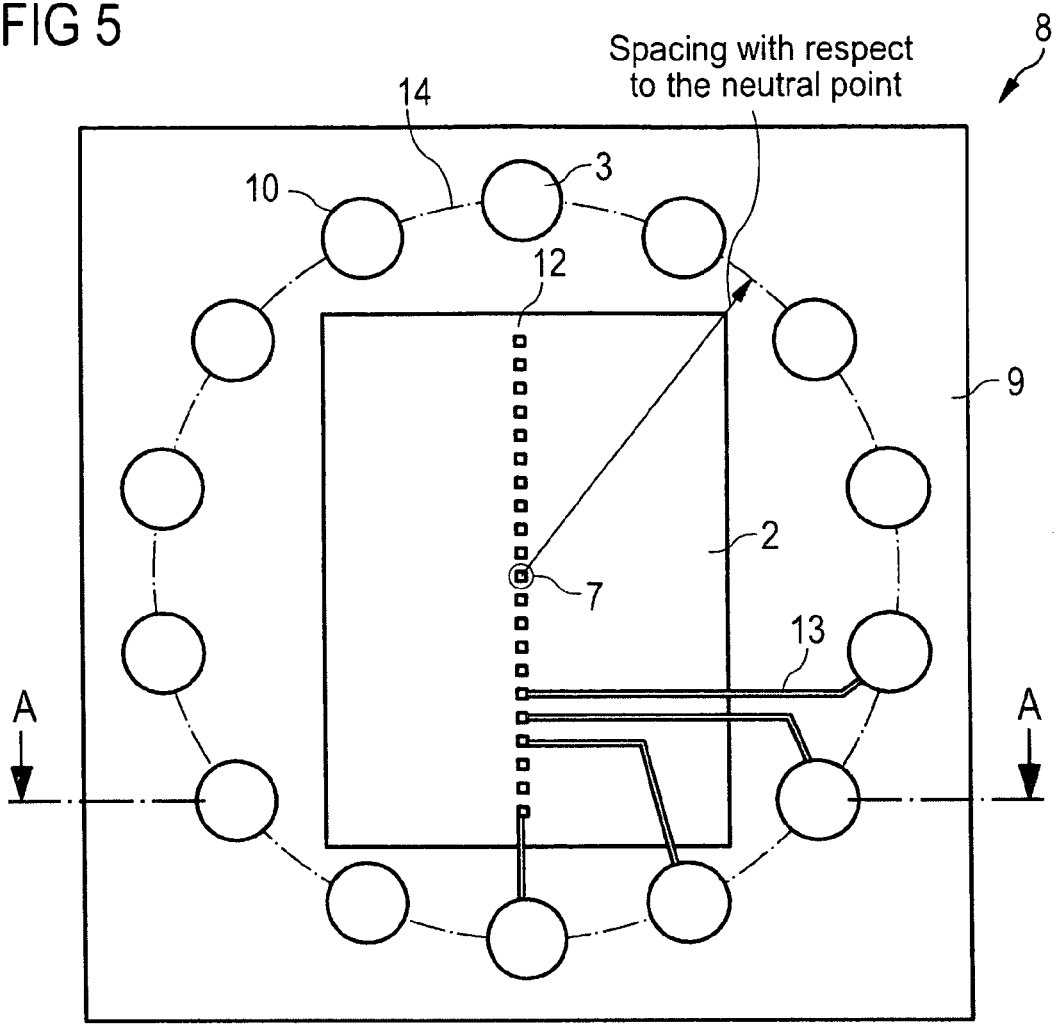
FIG 6  Section A-A
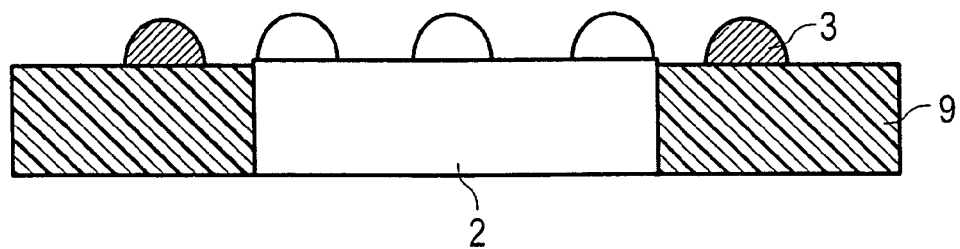

FIG 7
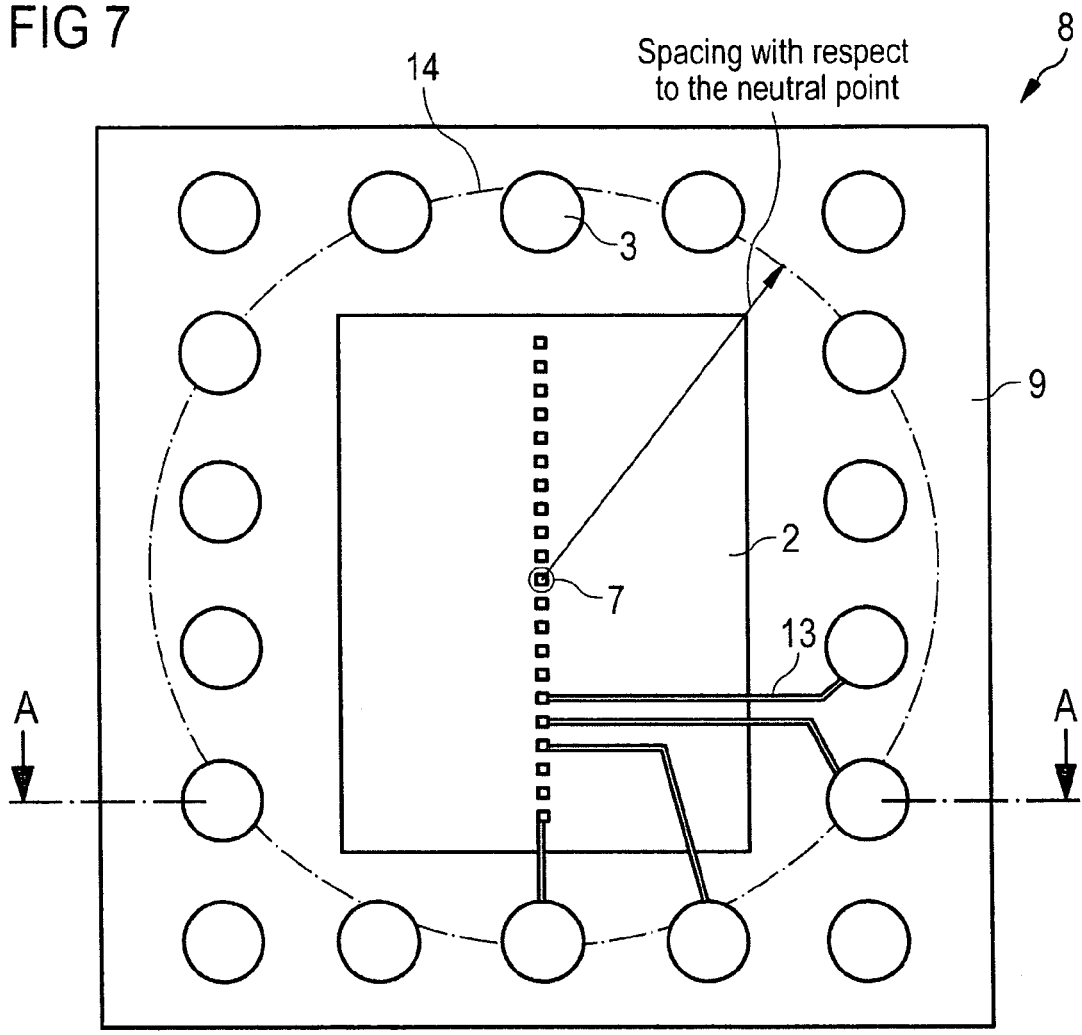
FIG 8  Section A-A
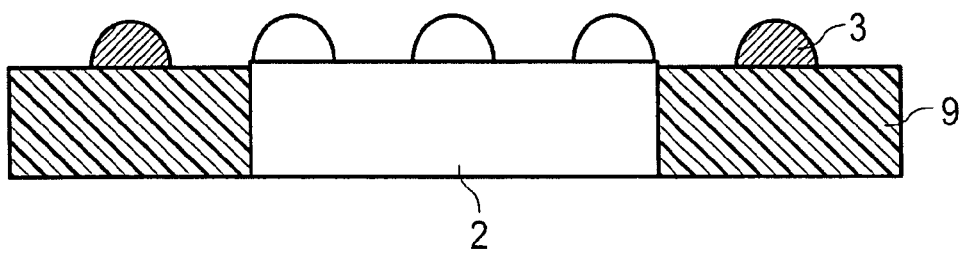

FLIP-CHIP COMPONENT

This application claims priority to German Patent Application 10 2004 050 178.5-33 which was filed Oct. 14, 2004, and is incorporated herein by reference.

TECHNICAL FIELD

The invention relates to a flip-chip component with a chip.

BACKGROUND

Memory devices realized on a semiconductor chip are often packaged using a leadframe, which is connected to a board via interconnections. The semiconductor chip may have contacting pads along the periphery or along a center row. The contacting pads electrically connect the chip to the leadframe either through wire-bonds or conductive bumps, or conductive paste or other means. The chip is mechanically connected to the leadframe with a tape or adhesive interposed in a way similar to flip-chip components. The leadframe may have a central bonding channel if the chip has center row contacting pads. The back side of the chip may be protected with a molding compound. Wire bridges are drawn through a bonding channel to a wiring on the side of the leadframe opposite to the chip. The wiring bridges thus electrically connect the contacting pads on the chip to the wiring. This wiring on the leadframe has contact pads also, on which interconnection elements, like solder balls, are arranged. The assembly can then be attached or soldered onto a printed circuit board (PCB). An example of such an arrangement is disclosed by German Patent Application DE 102 61 410 A1, which is incorporated herein by reference.

Classic connection technologies, such as wire bonding, are disadvantageous here because they will no longer support memory devices with high frequencies and high electrical performance. Further difficulties are caused by the coefficient of thermal expansion ("CTE") mismatch between the different materials used in the package.

In order to reduce parasitic inductances, capacitances or the electrical resistance associated with these connection technologies, flip-chip packages that have electrochemically deposited redistribution layers and flip-chip interconnect elements may be used. Flip-chip packages of this type are disclosed, for example, by U.S. Patent Publication No. 2004/0124540 A1 and European Patent No. 1 369 919 A1, both of which are incorporated herein by reference. In both cases, the chips are provided with a multiplicity of solder bumps, which are soldered to contact pads on a board.

However, because of the CTE mismatch between the board and the chip, fixed interconnections used on these flip-chip packages are not reliable under exposure to changing temperatures without additional process steps such as underfilling/undermolding. Underfilling/undermolding is the introduction of a plastic molding compound between the chip and the board as shown by U.S. Patent Publication Nos. 2004/0082107 A1 and 2003/0218261 A1, both of which are incorporated herein by reference. The plastic molding compound firmly adheres both to the chip and to the board. As a result, there is mechanical coupling between the chip and the board, which converts otherwise occurring shearing forces into bending forces.

This largely compensates for the CTE mismatch, but involves additional processing steps and consequent complexity. Further, problems arise during storage in moist conditions, because the plastic materials absorb moisture, leading to reduced reliability. In addition, this process is expensive and does not work in the case of printed circuit boards that are populated with components on both sides.

Instead of fixed interconnections, flexible interconnect elements may also be used, allowing compensation for the CTE mismatches that occur under exposure to changing temperatures. Examples of flexible interconnect structures are disclosed by German Patent Nos. DE 102 58 081 A1, DE 102 58 093 B3 and DE 102 41 589 A1, each of which is incorporated herein by reference. However, the mechanical load-bearing capacity of packages with such flexible interconnections is very low, so that additional measures are necessary for mechanical stabilization. However, such measures are complex and expensive, and counterproductive with respect to reliability.

Finally, German Patent No. DE 101 45 382 A1, which is incorporated herein by reference, describes a method for producing a semiconductor component in which the component is surrounded by a chip frame. Chips are singulated from a wafer, and arranged in a grid on a holding frame, the chips being spaced from one another in the grid. The chips may be attached to the holding frame by adhesive bonding. The space between the chips is filled with a polymer molding compound so as to encircle the chips on all sides, thus forming the chip frame. Component-specific redistribution layers and contact elements are then produced on this chip frame. Subsequently, the components are separated from one another by sawing the holding frame, and the individual components can then be mounted on a board.

SUMMARY OF THE INVENTION

Embodiments of the invention improve the reliability of a flip-chip package by reducing shear stresses in interconnections between the package and a board during changing temperatures.

This is achieved by use of a carefully selected material to be used in a chip frame and arranging the interconnections between the package and a board so as to minimize shear stresses in the interconnections. The chip frame, made of polymer, touches the chip on all four sides of the chip. The active surface of the chip and a surface of the frame are substantially coplanar. A redistribution layer electrically connects the contacting pads on the chip to interconnections between the package and the board. These interconnections are arranged on the frame in a predetermined pattern so as to reduce shear stresses on them during changing temperatures. The selection of the material for the chip frame is based on its CTE, such that its CTE is greater than that of the board to which the package is connected. The pattern of the interconnections is designed to equalize the thermal expansions of the package and the board during temperature changes.

Thus, under exposure to temperature changes, only extremely low mechanical loads, or ideally no mechanical loads, in particular no stress, act on the interconnections. This leads to substantially zero thermo-mechanical stresses in the interconnections.

In a first refinement of the invention, the coefficient of expansion ($CTE_{mold.\ comp}$) for the chip frame is chosen such that the thermal expansions of the assembly comprising the chip and the chip frame are equal to the expansion of the board.

In particular, it is provided that the coefficients of thermal expansion satisfy the following equation:

$$CTE_{board}*z*\Delta T = (CTE_{mold.\ comp}*x*\Delta T)*2 + CTE_{chip}*y*\Delta T$$

where z is the radial spacing of the interconnections from the neutral point on the chip, y is the width of the chip, and x is the distance between the interconnection and the edge of the chip.

In a first embodiment of the invention, it is provided that the interconnections on the chip frame are arranged substantially equidistantly on a circular path with respect to the neutral point on the chip. This ensures that each interconnection is not exposed to any shearing forces or tensile loads under exposure to changing temperatures.

Since an arrangement of the intermediate connections on a circular path does not correspond to the customary design specifications, a second embodiment of the invention provides that the interconnections on the chip frame are arranged in a rectangular array centered around the neutral point on the chip.

The interconnections may be solder balls, metallized polymer bumps or polymer bumps that are themselves conductive, or similar interconnections. The board may be a conventional printed circuit board, or a substrate used in conventional packages, or a ceramic substrate.

Finally, it is provided that the contacting pads located on the chip are connected by means of a redistribution layer to an associated interconnection on the chip frame.

BRIEF DESCRIPTION OF THE DRAWINGS

The invention is to be explained in more detail below on the basis of an exemplary embodiment. In the associated drawings:

FIG. 1 shows a schematic representation of a flip-chip arrangement on a board (prior art);

FIG. 2 shows a schematic representation of a flip-chip arrangement on a board under stress loading (prior art);

FIG. 3 shows a flip-chip component according to the invention, which is mounted on a board;

FIG. 4 shows a schematic representation of a flip-chip component as shown in FIG. 3 with the CTEs indicated;

FIG. 5 shows a plan view of the flip-chip component with a redistribution layer and mounted solder balls in a circular arrangement of the interconnections centered on the neutral point of the chip;

FIG. 6 shows a section A-A as shown in FIG. 5;

FIG. 7 shows a plan view of the flip-chip component with a redistribution layer and mounted solder balls in a rectangular arrangement of the interconnections centered around the neutral point of the chip; and FIG. 8 shows a section A-A as shown in FIG. 7.

The following list of reference symbols can be used in conjunction with the figures:

| 1  | board |
| 2  | chip |
| 3  | solder ball |
| 4  | landing pad on the chip |
| 5  | landing pad on the PCB |
| 6  | arrow |
| 7  | neutral point |
| 8  | flip-chip component |
| 9  | chip frame |
| 10 | landing pads on the chip frame |
| 11 | standoff |
| 12 | bonding pad |
| 13 | redistribution layer |
| 14 | circular ring |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1 and 2 illustrate the prior art in the case of a chip 2 mounted on a board 1 by flip-chip technology. The mounting takes place by soldering solder balls 3, which are electrically and mechanically connected to a chip landing pad 4 and a PCB landing pad 5. FIG. 1 shows in this case the arrangement at room temperature without any exposure to stress.

FIG. 2 shows the arrangement as shown in FIG. 1 under an elevated temperature. Since the board 1 has a greater CTE than the chip 2, the board 1 expands to a much greater degree than the chip 2. The consequence is a high stress loading (arrows 6) in the solder balls 3, the stresses increasing outwardly from the neutral point.

FIG. 3 shows a flip-chip component 8 according to embodiments of the invention, with a chip 2, which is surrounded by a chip frame 9. This chip frame 9 can, for example, be produced without any problem by a wafer molding process, as described for example in German Patent No. DE 101 45 382 A1. The chip frame 9 may at the same time serve as protection for the edges and back side of the chip and is in this case thicker than the chip 2. The active surface of the chip 2 and a surface of the frame 9 are substantially coplanar.

Solder balls 3 are arranged on chip-frame landing pads 10 equidistantly from the neutral point 7 on the chip frame 9. The pattern of the interconnections is designed so that the thermal expansion of the package 8 is approximately the same as that of the board 1. In effect, the effective CTE of the package 8 will equal that of the board 1. Consequently, when there is thermal loading, there will be no thermal stresses on the solder balls 3.

The interconnections that may be used to connect the package to the board are not restricted to solder balls alone. Any other interconnect element may be used instead of the solder balls 3, such as metallized polymer bumps or polymer bumps that are themselves conductive. Further, the standoff 11 of the interconnect connections may also be much smaller than in the case of packages that use solder balls for the interconnections.

The interconnection between the flip-chip component 8 and the board 1 is reliable when the expansions of the board 1 and of the flip-chip component 8 are equal. In embodiments of the present invention, such a CTE match can be achieved using the following formula:

$$CTE_{board}*z*\Delta T = (CTE_{mold.\ comp}*x*\Delta T)*2 + CTE_{chip}*y*\Delta T$$

where z is the radial spacing of the interconnections from the neutral point on the chip, y is the width of the chip, and x is the distance between the interconnection and the edge of the chip, the distance of each interconnection from the neutral point being ½*y+x. (FIG. 4). In the above formula, either the CTE's are the effective CTE of the respective material across the temperature range of interest, or the product of CTE and ΔT (CTE*ΔT) is the effective thermal expansion of the respective material across the temperature range of interest.

It follows that there is a spacing x on the chip frame 9 at which solder balls 3 may be located such that no thermomechanically induced stress can occur in the solder balls. This spacing x therefore depends on the effective thermal expansion the material of the chip frame, the board, and the chip.

By using embodiments of the invention, additional process steps to increase reliability, such as underfilling, may not be necessary.

One embodiment of a flip-chip component 8 according to the invention is represented in FIGS. 5 and 6. Here, the chip 2 is surrounded by the chip frame 9. Located on the chip 2 in a so-called center row arrangement are bonding pads 12, which are in each case connected to the landing pads 10 on the chip frame 9 by means of a redistribution layer 13. On the landing pads 10 there is in each case a solder ball 3.

The landing pads 10 on the chip frame 9 are arranged on a circular ring 14, the circle being centered on the neutral point 7. The different CTEs of the different materials then no longer lead to stress on the interconnections.

Since an arrangement of the interconnections on a circular ring does not correspond to customary design specifications, the solder balls 3 on the chip frame 9 may be arranged in a rectangular array with substantially equal spacing with respect to the neutral point 7 on the chip 2. The stress loading of the solder balls 3 located outside the circular ring 14 is negligible.

Although the present invention and its advantages have been described in detail, it should be understood that various changes, substitutions and alterations can be made herein without departing from the spirit and scope of the invention as defined by the appended claims.

What is claimed is:

1. A flip-chip component comprising:
a chip, wherein the chip includes pads located on an active surface of the chip;
a chip frame, wherein the chip frame is arranged around the chip and is attached to the chip so that the active surface of the chip is substantially planar with a top surface of the chip frame;
a redistribution layer overlying the active surface of the chip and the chip frame; and
interconnections disposed over the top surface of the chip frame, the interconnections disposed at a first distance from a neutral point on the active surface of the chip, wherein the interconnections are provided to electrically and mechanically connect the redistribution layer with a board, wherein a thermal expansion of an assembly comprising the chip and the chip frame in a region of the interconnections is equal to a thermal expansion of the board in the region of the interconnections, wherein the interconnections are arranged substantially equidistantly on a circular ring, with a center of the ring being the neutral point of the chip, and wherein the interconnections are arranged in a single row forming the circular ring.

2. The flip-chip component of claim 1, wherein a coefficient of thermal expansion of the chip frame is chosen such that the thermal expansion of the assembly comprising the chip and the chip frame in the region of the interconnections is equal to the thermal expansion of the board.

3. The flip-chip component of claim 1, wherein coefficients of thermal expansion of the chip, the chip frame and the board satisfy the following equation:

$$CTE_{board}*z*\Delta T = (CTE_{mold.\ comp}*x*\Delta T)*2 + CTE_{chip}*y*\Delta T$$

wherein z is a radial spacing of the interconnections from the neutral point of the chip, y is a width of the chip, and x is a distance between the interconnections and an edge of the chip, the distance of each interconnection from the neutral point being ½*y+x.

4. The flip-chip component of claim 1, wherein the interconnections comprise conductive materials.

5. The flip-chip component of claim 1, wherein the interconnections comprise solder balls.

6. The flip-chip component of claim 1, wherein the interconnections comprise conductive polymer bumps.

7. The flip-chip component of claim 1, wherein the redistribution layer electrically connects the pads located on the chip and the interconnections.

8. The flip-chip component of claim 1, wherein a coefficient of thermal expansion of the chip frame at any temperature is greater than a coefficient of thermal expansion of the board at the same temperature.

9. The flip-chip component of claim 1, wherein an effective coefficient of thermal expansion of the chip frame over a temperature range is greater than an effective coefficient of thermal expansion of the board over the same temperature range.

10. The flip-chip component of claim 1, wherein the component further includes the board.

11. The flip-chip component of claim 1, wherein there are no other interconnections between the interconnections and the neutral point.

12. The flip-chip component of claim 1, wherein the interconnections are arranged so that thermo-mechanical stresses induced in the interconnections during temperature changes are about zero.

13. A flip-chip component comprising:
a chip, herein the chip includes pads located on the chip;
a chip frame, wherein the chip frame is arranged around the chip and is attached to the chip so that an active surface of the chip is substantially planar with a surface of the chip frame;
a redistribution layer attached to the chip and the chip frame; and
interconnections, wherein the interconnections are provided to mechanically connect the redistribution layer to a board, wherein the interconnections are arranged so that thermo-mechanical stresses induced in the interconnections during temperature changes are zero, wherein the interconnections are arranged substantially equidistantly on a circular ring, with a center of the ring being a neutral point of the chip, and wherein the interconnections are arranged in a single row forming the circular ring.

14. The flip-chip component of claim 13, wherein an effective coefficient of thermal expansion of the chip frame over a temperature range is greater than an effective coefficient of thermal expansion of the board over the same temperature range.

15. The flip-chip component of claim 13, wherein a coefficient of thermal expansion of the chip frame at a temperature is greater than a coefficient of thermal expansion of the board at the same temperature.

16. The flip-chip component of claim 13, wherein an effective thermal expansion of an assembly comprising materials other than the interconnections and the board over a temperature range is substantially equal to an effective thermal expansion of the board over the same temperature range.

17. The flip-chip component of claim 13, wherein the component further includes the board.

18. A flip-chip component comprising:

pads disposed on an active surface of a chip;

a chip frame, wherein the chip frame is arranged around the chip and is attached to the chip so that the active surface of the chip is substantially planar with a top surface of the chip frame; and interconnections disposed over the top surface of the chip frame, the interconnections disposed at a first distance from a neutral point on the active surface of the chip and arranged radially around the neutral point, wherein the interconnections are provided to electrically and mechanically connect a redistribution layer with a board, and wherein a coefficient of thermal expansion of the chip frame is selected such that a thermal expansion of an assembly comprising the chip and the chip frame in a region of the interconnections is equal to a thermal expansion of the board in the region of the interconnections, wherein the interconnections are arranged radially in a single row around the neutral point.

19. The flip-chip component of claim 18, wherein the interconnections are arranged so that thermo-mechanical stresses induced in the interconnections during temperature changes are about zero.

* * * * *